US012666584B2

(12) United States Patent　　(10) Patent No.:　US 12,666,584 B2
Luo et al.　　　　　　　　　　　　(45) Date of Patent:　Jun. 23, 2026

(54) DISPLAY MODULE AND DISPLAY DEVICE

(71) Applicant: HKC CORPORATION LIMITED,
　　　　　　　Shenzhen (CN)

(72) Inventors: Fei Luo, Shenzhen (CN); Lidan Ye,
　　　　　　　Shenzhen (CN)

(73) Assignee: HKC CORPORATION LIMITED,
　　　　　　　Shenzhen (CN)

( * ) Notice:　Subject to any disclaimer, the term of this
　　　　　　　patent is extended or adjusted under 35
　　　　　　　U.S.C. 154(b) by 248 days.

(21) Appl. No.: 18/754,235

(22) Filed:　Jun. 26, 2024

(65)　　　　　Prior Publication Data

US 2025/0031325 A1　　Jan. 23, 2025

(30)　　　Foreign Application Priority Data

Jul. 19, 2023　(CN) .......................... 202310888751.0

(51) Int. Cl.
　H05K 7/20　　　(2006.01)
　G02F 1/1335　　(2006.01)
　H05K 5/02　　　(2006.01)
　*H10H 20/858*　　(2025.01)
(52) U.S. Cl.
　CPC ...　*H05K 7/20981* (2013.01); *G02F 1/133628*
　　　　　(2021.01); *H05K 5/0217* (2013.01); *H05K*
　　　　　*7/20263* (2013.01); *H10H 20/8586* (2025.01)
(58) Field of Classification Search
　None
　See application file for complete search history.

(56)　　　　　References Cited

U.S. PATENT DOCUMENTS 8,248,784 B2 *　8/2012　Nakamichi ........ H05K 7/20972
　　　　　　　　　　　　　　　　　　　　361/752
8,437,120 B2 *　5/2013　Lee ..................... H05K 5/0217
　　　　　　　　　　　　　　　　　　　　361/679.01
9,426,909 B2 *　8/2016　Choi .................... H05K 5/0226
9,655,258 B2 *　5/2017　Lee .......................... H05K 5/02
　　　　　　　　　　　(Continued)

FOREIGN PATENT DOCUMENTS

CN　　　101949527 A　　1/2011
CN　　　206988975 U　　2/2018
　　　　　　　(Continued)

OTHER PUBLICATIONS

Chinese Notification to Grant Patent Right for Invention, Chinese
Application No. 202310888751.0, mailed Aug. 28, 2023 (6 pages).

*Primary Examiner* — Courtney L Smith

(57)　　　　　　ABSTRACT
A display module is provided and includes: a backplane,
defining a receiving slot; a light source assembly, arranged
at a bottom of the receiving slot; an optical substrate,
snapped to an upper portion of the accommodation slot,
wherein a sealing cavity is defined between the optical
substrate and the optical source assembly; a coolant,
received in the sealing cavity; and a self-sealing fixation
assembly, rotatably arranged on a slot wall of the receiving
slot. In a first state, the optical substrate abuts against the
self-sealing fixation assembly in a direction towards the
bottom of the receiving slot; and, in a second state, the
self-sealing fixation assembly is in an interference fit with
the optical substrate, the self-sealing fixation assembly and
the optical substrate are locked with each other to coopera-
tively define the sealing cavity.

18 Claims, 3 Drawing Sheets

(56)                    References Cited

U.S. PATENT DOCUMENTS

| | | | | |
|---|---|---|---|---|
| 10,203,533 B2 * | 2/2019 | Kang | ............... | G02F 1/133308 |
| 10,355,732 B2 * | 7/2019 | Wilson | ................... | H04M 1/18 |
| 10,867,154 B2 * | 12/2020 | Lee | ................... | G06V 40/1365 |
| 11,785,733 B2 * | 10/2023 | Cha | ...................... | G06F 1/1601 |
| | | | | 361/679.01 |
| 2018/0180798 A1 | 6/2018 | Kim | | |

FOREIGN PATENT DOCUMENTS

| | | | |
|---|---|---|---|
| CN | 112823310 A | 5/2021 |
| CN | 113394205 A | 9/2021 |
| CN | 214669985 U | 11/2021 |
| CN | 114265243 A | 4/2022 |
| JP | 2020194616 A | 12/2020 |
| WO | 2021227732 A1 | 11/2021 |

* cited by examiner

100

DISPLAY MODULE AND DISPLAY DEVICE

CROSS REFERENCE TO RELATED APPLICATION

The present application claims priority of the Chinese patent application No. 202310888751.0, filed on Jul. 19, 2023, and contents of which are incorporated herein by its entireties.

TECHNICAL FIELD

The present disclosure relates to the field of displays, and in particular to a display module and a display device.

BACKGROUND

As displaying technologies develop, a power of a display device and heat generated by the display device is increasing. Especially, for a Mini-Light Emitting Diode (Mini-LED) device, in order to save costs for chips, displaying of the LED is controlled by scanning, and in this case, a power of a single LED and heat generated by the single LED are improved. If the heat is not dissipated effectively, a service life of the display device is affected.

Heat dissipation by cooled liquid is highly efficient and has a low cost, and therefore, the heat dissipation by cooled liquid is suitable for dissipating heat for the display device. To configure the heat dissipation by cooled liquid, difficulty of assembling the display device is increased, and it is difficult to ensure sealing for coolant after the display device is assembled.

SUMMARY OF THE DISCLOSURE

The present disclosure provides a display module and a display device to allow the display device to be assembled easily and to ensure the sealing for the coolant.

In a first aspect, a display module is provided and includes: a backplane, defining a receiving slot; a light source assembly, arranged at a bottom of the receiving slot; an optical substrate, snapped to an upper portion of the receiving slot, wherein a sealing cavity is defined between the optical substrate and the optical source assembly; a coolant, received in the sealing cavity; a self-sealing fixation assembly, rotatably arranged on a slot wall of the receiving slot, wherein, in a first state, the optical substrate abuts against the self-sealing fixation assembly in a direction towards the bottom of the receiving slot; and, in a second state, the self-sealing fixation assembly is in an interference fit with the optical substrate, the self-sealing fixation assembly and the optical substrate are locked with each other to cooperatively define the sealing cavity.

In some embodiments, the self-sealing fixation assembly includes: a rotation shaft, fixed to the upper portion of the receiving slot; a compression member, comprising a first compression strip and a second compression strip, wherein an end of the first compression strip is connected to an end of the second compression strip, an angle between the first compression strip and the second compression strip is not greater than 90 degrees. A through hole is defined in a connection between the first compression strip and the second compression strip, the compression member sleeves the rotation shaft through the through hole. In the first state, the compression member is at a first position in which the first compression strip is attached to the slot wall. In the second state, the compression member is at a second position, the second compression strip is attached to the slot wall, and the first compression strip compresses a side of the optical substrate away from the light source assembly in the direction toward the bottom of the receiving slot.

In some embodiments, the compression member is a one-piece and integral structure and is a thermoplastic polyurethane elastic member.

In some embodiments, the receiving slot is a stepped slot and includes: a first blind slot; and a second blind slot, wherein the second blind slot is defined in a central region of a bottom of the first blind slot, the light source assembly is arranged at a bottom of the second blind slot. A region of the bottom of the first blind slot surrounding the second blind slot is arranged with a protrusion, a snapping slot is defined between the protrusion and a slot wall of the first blind slot; the protrusion is arranged with a sealing adhesive; and in the second state, the protrusion supports an edge of the optical substrate.

In some embodiments, the optical substrate comprises a body portion and a snapping portion disposed at an edge of the body portion, the snapping portion is extending perpendicularly to the body portion. In the first state, the snapping portion abuts against the second compression strip in the direction towards the bottom of the receiving slot; and in the second state, the second compression strip is attached to the snapping portion to be snapped in the snapping slot. A sum of a thickness of the snapping portion and a thickness of the second compression strip is equal to a size of an opening of the snapping slot to enable the optical substrate to be in the interference fit with the compression member to tightly lock the optical substrate.

In some embodiments, an outer edge of a connection between the body portion and the snapping portion is configured as a smooth arc.

In some embodiments, the backplane defines a threaded hole, and the rotation shaft is detachably fixed to the receiving slot by threaded connection.

In some embodiments, the display module further includes: a heat circulating pipe group, comprising a heat absorbing portion and a heat releasing portion. The heat absorbing portion is disposed between the bottom of the receiving slot and the light source assembly. The heat releasing portion is disposed, relative to the heat absorbing portion, away from the light source assembly and is embedded in the backplane, the heat absorbing portion is fluidly connected to the heat releasing portion, and a coolant is received in the heat absorbing portion and is configured to freely move therein.

In some embodiments, the coolant is ultrapure water.

In a second aspect, a display device is provided and includes the display module as described in the above aspect and a border. The border surrounds the display module.

According to the present disclosure, the display module and the display device are provided. The display module includes a backplane, a light source assembly, an optical substrate, a coolant, and a self-sealing fixation assembly. The self-sealing fixation assembly is rotatably arranged on the slot wall of the receiving slot. When mounting the optical substrate, the display module is in the first state. The optical substrate abuts against the self-sealing fixation assembly towards the bottom of the receiving slot. During a process of mounting the optical substrate, the self-sealing fixation assembly is compressed to rotate towards the bottom of the receiving slot by a preset angle, and the mounting process is completed. The display module is then switched to the second state, in the second state, the self-sealing fixation assembly is in an interference fit with the optical substrate to be tightly locked with the optical substrate, such that the self-sealing fixation assembly and the optical substrate cooperatively define a sealing cavity. By arranging the self-sealing fixation assembly, when the coolant and the optical substrate are sealed and mounted, the only operations that need to do are: injecting the coolant into the receiving slot and taking the optical substrate to compress the self-sealing fixation assembly. The self-sealing fixation assembly is compressed to rotate at the preset angle and is in the interference fit with the optical substrate to be tightly locked with the optical substrate. In this way, the self-sealing fixation assembly and the optical substrate cooperatively define the sealing cavity, ensuring that the coolant is not leaked. Mounting of the optical substrate and the coolant are completed. The self-sealing fixation assembly reduces the difficulty in assembling the heat dissipation by cooled liquid, and the sealing for the coolant is ensured.

BRIEF DESCRIPTION OF THE DRAWINGS

In order to more clearly illustrate the technical solutions in the embodiments of the present disclosure, the accompanying drawings for describing the embodiments will be introduced briefly in the following. Apparently, the following accompanying drawings show only some of the embodiments of the present disclosure. Any ordinary skilled person in the art may obtain other accompanying drawings based on the accompanying drawings without any creative work.

REFERENCE NUMERALS IN THE DRAWINGS

Figure 1:
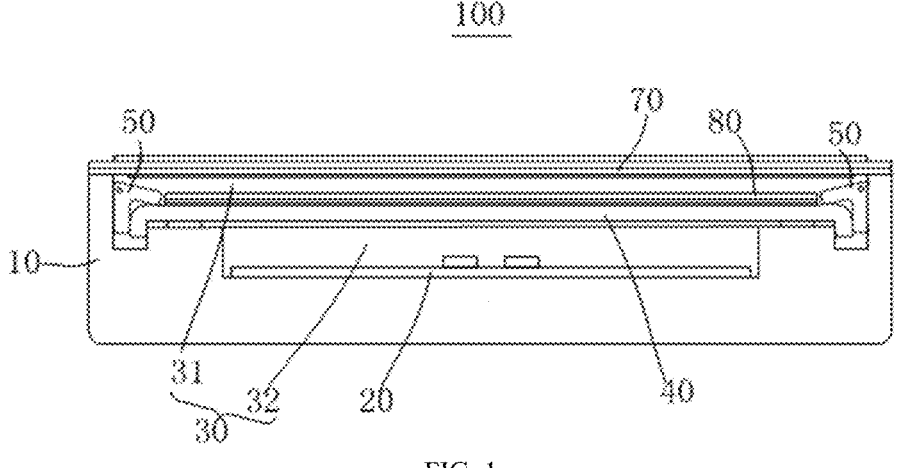
FIG. 1 is a structural schematic view of a display module according to an embodiment of the present disclosure.

100, display module; 10, backplane; 20, light source assembly; 30, receiving slot; 31, first blind slot; 32, second blind slot; 33, protrusion; 34, snap slot; 35, sealing adhesive; 40, optical substrate; 41, snapping portion; 42, body section; 50, self-sealing fixation assembly; 51, first compression strip; 52, rotary shaft; 53, second compression strip; 80, optical film; 70 liquid crystal glass; 60, heat circulation pipe group; 61, heat absorbing portion; 62, heat releasing portion.

DETAILED DESCRIPTION

Technical solutions in the embodiments of the present disclosure will be clearly and completely described below by referring to the accompanying drawings in the embodiments of the present disclosure. Apparently, the described embodiments are only a part of but not all of the embodiments of the present disclosure. All other embodiments, which are obtained by any ordinary skilled person in the art based on the embodiments of the present disclosure without making any creative work, shall fall within the scope of the present disclosure.

Terminologies in the embodiments of the present disclosure is used merely for the purpose of describing a particular embodiment and is not intended to limit the present disclosure. The singular form "a", "said", and "the" used in the embodiments and appended claims of the present disclosure are intended to include a plural form of the feature, unless clearly indicated in the context. The term "a plurality" generally include at least two, but does not preclude a case of at least one.

It should be understood that the term "and/or" used herein is merely a description of an association relationship of associated objects, indicating that three types of relationships may exist. For example, A and/or B means that, the A is present alone, both A and B are present, and the B is present alone. In addition, the character "/" herein generally indicates that the object before the character "or" the object after the character.

It should be understood that the terms "including", "comprising", or any variations thereof, are used to indicate non-exclusive inclusion. Therefore, a process, a method, an article, or an apparatus including a set of elements includes not only the listed elements but also include other elements that are not explicitly listed or include elements that are inherently included in the process, the method, the article, or the apparatus. Without further limitation, an element that is defined by the phrase "including" does not preclude existence of additional identical element included in the process, the method, the article or the apparatus.

To be noted that, any directional indications (such as up, down, left, right, forward, backward) in the embodiments of the present disclosure are only used to explain a relative positional relationship or a movement between components in a particular attitude (the attitude as shown in the drawings). If the particular attitude is changed, the directional indications shall be changed accordingly.

Reference to "embodiments" herein implies that particular features, structures, or properties described in the embodiments may be included in at least one embodiment of the present disclosure. The presence of the term at various sections in the specification does not necessarily refer to a same embodiment or a separate or alternative embodiment that is mutually exclusive of other embodiments. Any ordinary skilled person in the art shall understand that, both explicitly and implicitly, the embodiments described herein may be combined with other embodiments.

When the cooled liquid-based heat dissipation is applied to a display device, difficulty of assembling the display device is increased, and it is difficult to ensure the sealing for the coolant after the display device is assembled.

In order to solve the above problem, the present disclosure provides a display module and a display device in which a self-sealing fixation assembly is arranged, and the above problems are effectively solved.

The display module and the display device provided by the present disclosure will be described in detail in the following by referring to the accompanying drawings and embodiments.

Figure 2:
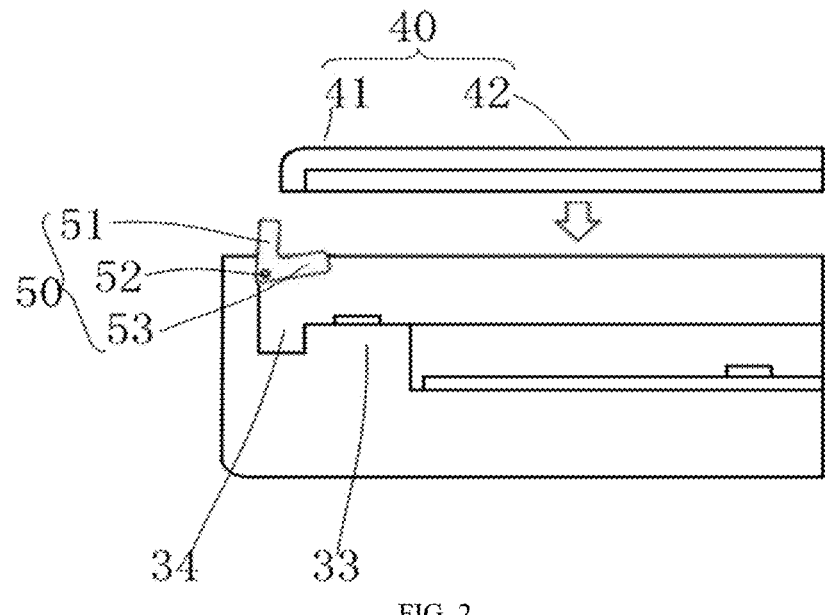
FIG. 2 is a structural schematic view of the display module in FIG. 1 before being mounted.
Figure 3:
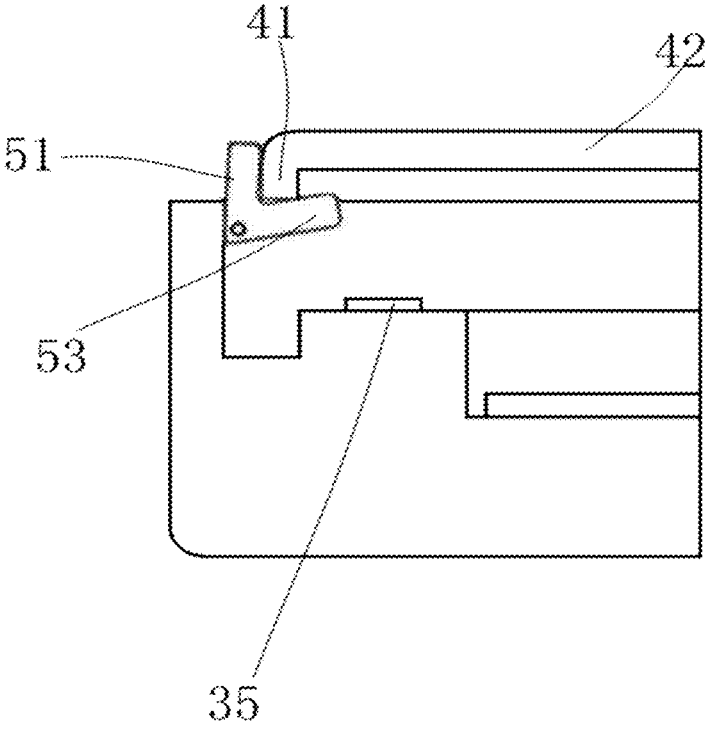
FIG. 3 is a structural schematic view of a portion of the display module in FIG. 1 in a first state.
Figure 4:
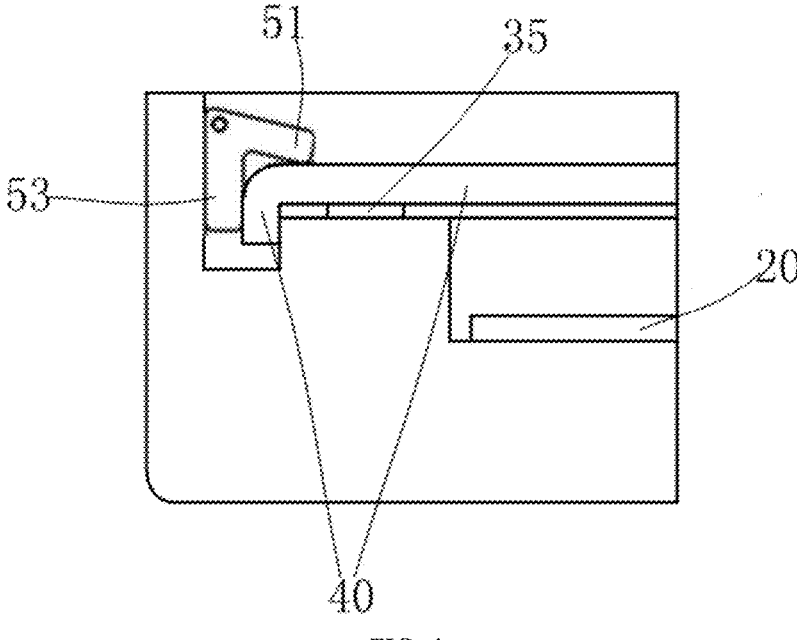
FIG. 4 is a structural schematic view of a portion of the display module in FIG. 1 in a second state.
Figure 5:
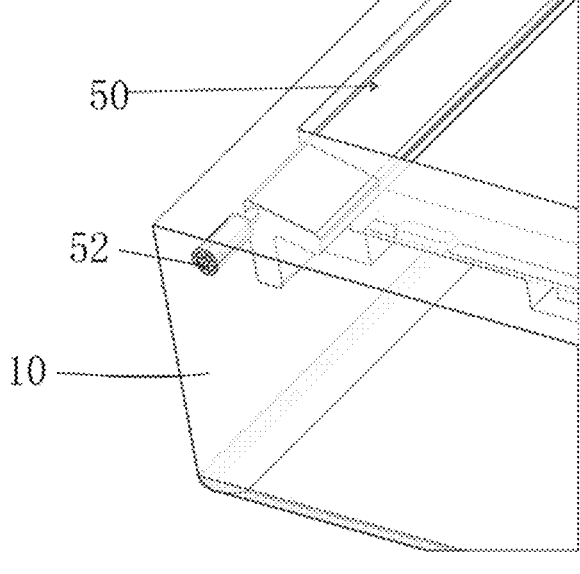
FIG. 5 is a structural schematic view of an exterior of a backplane of the display module in FIG. 1.
Figure 6:
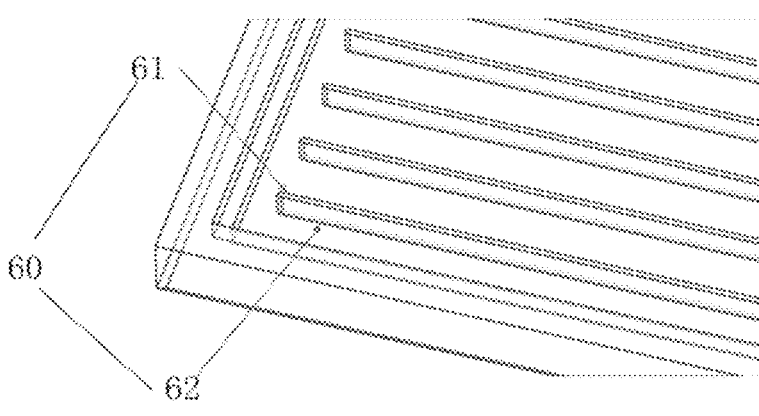
FIG. 6 is a structural schematic view of an interior of the backplane of the display module in FIG. 1.

As shown in FIG. 1 to FIG. 6, FIG. 1 is a structural schematic view of the display module according to an embodiment of the present disclosure; FIG. 2 is a structural schematic view of the display module in FIG. 1 before being mounted; FIG. 3 is a structural schematic view of a portion of the display module in FIG. 1 in a first state; FIG. 4 is a structural schematic view of a portion of the display module in FIG. 1 in a second state; FIG. 5 is a structural schematic view of an exterior of a backplane of the display module in FIG. 1; and FIG. 6 is a structural schematic view of an interior of the backplane of the display module in FIG. 1. In the present embodiment, the display module 100 includes a backplane 10, a light source assembly 20, an optical substrate 40, a coolant and a self-sealing fixation assembly 50.

The backplane 10 defines a receiving slot 30. The light source assembly 20 is arranged on a bottom of the receiving slot 30. The optical substrate 40 is snapped to be fixed to an upper portion of the receiving slot 30. A sealing cavity (not labeled) is defined between the optical substrate 40 and the light source assembly 20. The coolant (not labeled) is received in the sealing cavity. Specifically, in the present disclosure, the cooled liquid-based heat dissipation is applied to dissipate heat from the light source assembly 20 of the display module 100 and has a high heat dissipation efficiency and low cost. In the present embodiment, the coolant is received in the sealing cavity between the optical substrate 40 and the light source assembly 20. In this way, the coolant directly contacts the light source assembly 20, such that the coolant immediately absorbs heat generated by the light source assembly 20 and disperses the heat as the coolant diffuses, such that the heat dissipation effect is improved. In the present embodiment, the display module 100 is a Mini-LED display module 100 in which back light emits straightly to a screen. The light source assembly 20 includes a light board and a plurality of LEDs disposed on the light board. The coolant contacts the plurality of LEDs to dissipate heat from the plurality of LEDs. In some embodiments, for the display module 100 in which back light emits to the screen from a left or right side thereof, the light source assembly 20 may include a light guide plate and a side light source disposed on a side of the light guide plate. The present disclosure dose not limit a type of back light emission.

The display module 100 further includes a self-sealing fixation assembly 50. The self-sealing fixation assembly 50 is rotatably arranged on a slot wall of the receiving slot 30. When the optical substrate 40 is being mounted, the display module 100 is in a first state. In the first state, the optical substrate 40 abuts against the self-sealing fixation assembly 50 towards a bottom of the receiving slot 30. The self-sealing fixation assembly 50 is compressed to rotate towards the bottom of the receiving slot 30 by a preset angle. In this way, a process of mounting the optical substrate 40 is completed. After the mounting is completed, the display module 100 is in a second state. In the second state, the self-sealing fixation assembly 50 is in an interference fit with the optical substrate 40, such that the self-sealing fixation assembly 50 and the optical substrate 40 are tightly locked with each other to cooperatively define the sealing cavity. Specifically, when the cooled liquid-based heat dissipation is applied to dissipate heat from the display module 100, the coolant needs to be sealed inside the display module 100, the display module 100 may be assembled difficultly, and the sealing may not be ensured easily. In the present embodiment, the self-sealing fixation assembly 50 is located on an upper portion of the slot wall of the receiving slot 30. When assembling the display module 100, a liquid level mark is labeled in the receiving slot 30, the coolant is injected into the receiving slot 30, which has received the backplane 10 of the light source assembly 20 therein, to reach the liquid level mark. The coolant submerges the light source assembly 20. The self-sealing fixation assembly 50 is located at (aligned to) the liquid level mark. When mounting the optical substrate 40, an edge of the optical substrate 40 compresses the self-sealing fixation assembly 50 towards the bottom of the receiving slot 30. The self-sealing fixation assembly 50, after being compressed, rotates at the preset angle. The rotated self-sealing fixation assembly 50 compresses the optical substrate 40 towards the bottom of the receiving slot 30. The rotated self-sealing fixation assembly 50 snaps the optical substrate 40 to fix the optical substrate 40 in the receiving slot 30. In this way, the process of mounting the coolant and the optical substrate 40 of the display module 100 is completed. The slot wall of receiving slot 30, the self-sealing fixation assembly 50, the optical substrate 40, and the light source assembly 20 cooperatively define the sealing cavity.

According to the display module 100 provided in the present disclosure, the cooled liquid-based heat dissipation is applied to dissipate heat from the display module 100. In the present disclosure, the self-sealing fixation assembly 50 is arranged, and when sealing and mounting the coolant and the optical substrate 40, the coolant is injected into the receiving slot 30, and the optical substrate 40 is taken to compress the self-sealing fixation component 50. The self-sealing fixation component 50, after being compressed, rotates at the preset angle. After rotating, the self-sealing fixation component 50 is in the interference fit with the optical substrate 40, such that the self-sealing fixation assembly 50 and the optical substrate 40 are tightly locked with each other to cooperatively define the sealing cavity, ensuring that the coolant is not leaked. In this way, the process of mounting the optical substrate 40 and the coolant is completed. By arranging the self-sealing fixation assembly 50, difficulty of assembling the cooled liquid-based heat dissipation is reduced, and the sealing for the coolant after the assembling is ensured.

Further, the coolant specifically may be alcohol, glycerin, ethylene glycol, and the like. In the present embodiment, the coolant may be ultrapure water. The ultrapure water is insulative, has a large specific heat capacity, and is colorless and transparent. Taking the ultrapure water as the coolant may prevent the display module 100 from being short circuited. The cooling effect is improved without affecting a displaying effect of the display module 100.

In the present embodiment, the self-sealing fixation assembly 50 includes a rotation shaft 52 and a compression member. The rotation shaft 52 is fixed to the upper portion of the receiving slot 30. The compression member includes a first compression strip 51 and a second compression strip 53. An end of the first compression strip 51 is connected to an end of the second compression strip 53. An angle between the first compression strip 51 and the second compression strip 53 is not greater than 90 degrees. A through hole is defined at connection between the first compression strip 51 and the second compression strip 53. The compression member sleeves the rotation shaft 52 through the through hole. A distance between the second compression strip 53 and the bottom of the receiving slot 30 is less than a distance between the first compression strip 51 and the bottom of the receiving slot 30. The self-sealing fixation assembly 50 is configured as follows. When the optical substrate 40 is mounted, i.e., in the first state, the compression member is at a first position, and the first compression strip 51 attaches to the slot wall. When the optical substrate 40 is mounted, the optical substrate 40 compresses the second compression strip 53 to enable the compression member to rotate around the rotation shaft 52, until the mounting process is completed, and the display module 100 is in the second state. In the second state, the compression member is at a second position, and the second compression strip 53 abuts against the slot wall to allow the first compression strip 51 to compress a side of the optical substrate 40 away from the light source assembly 20 in a direction towards the bottom of the receiving slot 30. Specifically, the rotation shaft 52 allows the compression member to be rotatable. Before mounting the optical substrate 40, the compression member is at the first position, and at the first position, the first compression strip 51 attaches a portion of the slot wall above the rotation shaft 52, and the second compression strip 53 extends laterally away from the slot wall. When the optical substrate 40 is being mounted, the optical substrate 40 compresses the laterally extending second compression strip 53 to drive the compression member to rotate, such that the compression member rotates to reach the second position. At the second position, the second compression strip 53 abuts against another portion of the slot wall below the rotation shaft 52, and the first compression strip 51 extends laterally away from the slot wall. When the first compression strip 51 rotates from a position of abutting against the portion of the slot wall above the rotation shaft 52 to another position of extending laterally away from the slot wall, the first compression strip 51 slides relative to the optical substrate 40 and eventually compresses the side of the optical substrate 40 away from the optical assembly.

Further, in order to improve reliability of mounting of the optical substrate 40 and improve the sealing of the sealing cavity, in the present embodiment, the receiving slot 30 is a stepped slot. The receiving slot 30 includes: a first blind slot 31 and a second blind slot 32. The second blind slot 32 is defined at a central region of a bottom of the first blind slot 31. The light source assembly 20 is disposed at a bottom of the second blind slot 32. A region of the bottom of the first blind slot 31 surrounding the second blind slot 32 is arranged with a protrusion 33. A snapping slot 34 is defined between the protrusion 33 and the slot wall of the first blind slot 31. The protrusion 33 is arranged with a sealing adhesive 35. In the second state, the protrusion 33 supports an edge of the optical substrate 40, and the sealing adhesive 35 providing a sealing effect. Specifically, when the second compression strip 53 of the compression member compresses the optical substrate 40, the optical substrate 40 is supported on the protrusion 33 and covers an opening of the second blind slot 32. The sealing cavity is formed in the second blind slot 32. The protrusion 33 is attached to the optical substrate 40 by the sealing adhesive 35 to support the optical substrate 40 and to form the sealed sealing cavity.

Further, the optical substrate 40 includes a body portion 42 and a snapping portion 41 disposed at an edge of the body portion 42. The snapping portion 41 is perpendicularly disposed to the body portion 42. When the optical substrate 40 is being mounted, i.e., in the first state, the snapping portion 41 abuts against the second compression strip 53 towards the bottom of the receiving slot 30. When the optical substrate 40 is being mounted, the snapping portion 41 compresses the second compression strip 53 to rotate at the preset angle to reach the second state. In the second state, the second compression strip 53 attaches to the snapping portion 41 and slides into the snapping slot 34. A sum of a thickness of the snapping portion 41 and a thickness of the second compression strip 53 is equal to a size of an opening of the snapping slot 34, such that the optical substrate 40 is locked by the interference fit. Specifically, the optical substrate 40 is in the interference fit with the compression member to be snapped in the receiving slot 30. The optical substrate 40 includes the body portion 42 and the perpendicular snapping portion 41. When mounting the optical substrate 40, the second compression strip 53 is compressed by the snapping portion 41. When the second compression strip 53 is being compressed and rotating, the snapping portion 41 and the second compression strip 53 are in contact with each other and move relative to each other. The snapping portion 41 is moved till abutting against the second compression strip 53, the snapping portion 41 and the second compression strip 53 slide into the snapping slot 34 together, and the first compression strip 51 abuts against the body portion 42. In this way, the interference fit is achieved. The second compression strip 53 and the snapping portion 41 are snapped in the snapping slot 34, and self-locking is formed, such that the compression member and the optical substrate 40 cannot rotate reversely after the optical substrate 40 is mounted, and the display module 100, after being assembled, is more reliable.

Further, in a process of the optical substrate 40 compressing the compression member, the first compression strip 51 rotates while attaching to a connection between the snapping portion 41 and the body portion 42 of the optical substrate 40. In order to facilitating mounting, in some embodiments, an outer edge of the connection between the body portion 42 and the snapping portion 41 is configured to be a smooth arc. The edge is configured as an arc chamfer. In this way, when the compression member is rotating, the first compression strip 51 may rotate relative to the optical substrate 40 easily. Further, in the present embodiment, an end of the snapping portion 41 away from the body portion 42 has a side near the body portion 42, and an outer edge of the side is also configured to be a smooth arc, facilitating the snapping portion 41 to be snapped into the snapping slot 34.

Further, in the present embodiment, in order to disassemble the display module 100 and to perform maintenance of the display module 100 easily, the backplane 10 defines a threaded hole. The rotation shaft 52 is fixed in the receiving slot 30 by being threaded arranged in the threaded hole. When the locking between the compression member and the optical substrate 40 is to be released, the rotation shaft 52 is screwed and disassembled to release the compression member and the optical substrate 40. Specifically, the rotation shaft 52 includes a shaft post at a middle portion of the shaft and two thread connectors respectively located at two ends of the shaft post. The thread connectors engage with the threaded hole to secure the rotation shaft 52 to the receiving slot 30. When the optical substrate 40 is to be disassembled, the thread connectors of the rotation shaft 52 are screwed by a screwdriver to extract the rotation shaft 52. After the rotation shaft 52 is extracted, the optical substrate 40 may be taken out, and the display module 100 is disassembled.

Further, to further improve the heat dissipation efficiency of the display module 100, in the present embodiment, the display module 100 further includes a heat circulation pipe group 60. The heat circulation pipe group 60 includes a heat absorbing portion 61 and a heat releasing portion 62. The heat absorbing portion 61 is disposed between the bottom of the receiving slot 30 and the light source assembly 20. The heat releasing portion 62 is located, with respect to the heat absorbing portion 61, further away from the light source assembly 20 and is embedded in the backplane 10. The heat absorbing portion 61 is fluidly connected to the heat releasing portion 62. The coolant is received in the heat circulation pipe group 60 and can move freely therein. Specifically, in the present embodiment, the heat of the light source assembly 20 is dissipated in two ways, such that the heat dissipation efficiency is improved, and accumulation of the heat is prevented. The heat absorbing portion 61 and the heat releasing portion 62 are pipes that are communicated with each other. The heat absorbing portion 61 is tightly attached to the light source assembly 20, and the heat releasing portion 62 is located relatively far away from the light source assembly 20 and is embedded in the backplane 10. The coolant may circulate within the heat absorbing portion 61 and the heat releasing portion 62. When the display module 100 is displaying information, heat generated when the light source assembly 20 is operating is absorbed by the coolant within the heat absorbing portion 61 and is transmitted to the heat releasing portion 62 as the coolant in the heat absorbing portion 61 flows. In this way, the heat is diffused through the backplane 10 and is prevented from being accumulated. The heat generated by the light source assembly 20 is further absorbed by the coolant inside the sealing cavity. The heat is taken away as the coolant diffuses. Since the above two heat dissipation methods are applied in combination, the heat dissipation efficiency is increased. The coolant in the heat circulation pipe group 60 may specifically be alcohol, glycerin, ethylene glycol, and so on, which will not be limited herein.

Further, in the present embodiment, the angle between the first compression strip 51 and the second compression strip 53 is not greater than 90 degrees. For example, the angle may be 65 degrees, 70 degrees, 75 degrees, 80 degrees, 85 degrees, 90 degrees, and so on, which will not be limited herein. In this way, when the second compression strip 53 is compressed, the first compression strip 51 is driven to rotate. In addition, by configuring the angle, the compression member is prevented from occupying an excessively large space, such that the display module 100 may not be thicker. In addition, it is ensured that the first compression strip 51 compresses the optical substrate 40 to enhance the sealing effect applied by the optical substrate 40 on the coolant.

The self-sealing fixation assembly 50 is provided on each of at least two opposite side walls of the receiving slot 30. In the present embodiment, each of four side walls of the receiving slot 30 is arranged with one self-sealing fixation assembly 50.

Further, the compression member is a one-piece and integral structure. The compression member is a thermoplastic polyurethane elastic member. Specifically, the thermoplastic polyurethane elastic member is a material having flexibility and has a Shore hardness of 85 degrees to 90 degrees, such as 85 degrees, 87 degrees, 89 degrees, 90 degrees, and the like. In this way, when achieving the self-locking, the compression member form the interference fit with the optical substrate 40 better. Since the compression member is a one-piece and integral structure, the compression member may have better structural stability and may be formed by injection molding.

In the present embodiment, the optical substrate 40 is specifically a diffusion plate and is configured to allow light, which is originally emitted from the light source assembly 20, to emit uniformly on a light-emitting surface after passing through the diffusion plate. The diffusion plate has good haze, light transmittance, diffusivity, and so on. The diffusion plate may convert a point light or a linear light into a soft and uniform surface light. The diffusion plate is arranged to ensure the displaying effect of the display module. In some embodiments, a side of the diffusion plate away from the light source assembly 20 is arranged with an optical film 80. The opening of the first blind slot 31 is covered by a liquid crystal glass 70. Further, the diffusion plate may be specifically made from glass, polystyrene, polycarbonate, polyethylene, polypropylene, polyvinyl chloride, polyethylene terephthalate, acrylic, propenoic acid, and the like, which will not be limited herein.

In the present disclosure, the display module 100 is provided in which the cooled liquid-based heat dissipation is applied for heat dissipation. The self-sealing fixation assembly 50 is arranged. When sealing and mounting the coolant and the optical substrate 40, the coolant is injected into the receiving slot 30, and then, the optical substrate 40 is arranged to compress the self-sealing fixation assembly 50. The self-sealing fixation assembly 50 is compressed to rotate at a preset angle. After rotation, the self-sealing fixation assembly 50 is in the interference fit with the optical substrate 40, such that the self-sealing fixation assembly 50 and the optical substrate 40 are locked with each other to cooperatively define the sealing cavity to ensure that the coolant is not leaked. In this way, mounting of the optical substrate 40 and the coolant is completed. By arranging the self-sealing fixation assembly 50, the difficulty of assembling the cooled liquid-based heat dissipation is reduced, and the sealing for the coolant is ensured after the assembling. On the other hand, in the present disclosure, the coolant and the heat circulation pipe group 60 are both arranged for heat dissipation. Two heat dissipation methods operate together to improve the heat dissipation efficiency, and the service life of the display module 100 may be extended effectively.

Correspondingly, the present disclosure further provides a display device. The display device includes the display module 100 and a border. The border surrounds the display module 100. The display module 100 may be the display module 100 as described in the above embodiments.

The above describes only embodiments of the present disclosure, and do not limit the scope of the present disclosure. Any equivalent structure or equivalent process transformation performed based on the contents of the specification and the accompanying drawings of the present disclosure, applied directly or indirectly in other related fields, shall all be reasonably included in the scope of the present disclosure.

What is claimed is:

1. A display module, comprising:
   a backplane, defining a receiving slot;
   a light source assembly, arranged at a bottom of the receiving slot;
   an optical substrate, snapped to an upper portion of the receiving slot, wherein a sealing cavity is defined between the optical substrate and the light source assembly;
   a coolant, received in the sealing cavity;
   a self-sealing fixation assembly, rotatably arranged on a slot wall of the receiving slot, wherein, in a first state, the optical substrate abuts against the self-sealing fixation assembly in a direction towards the bottom of the receiving slot; and, in a second state, the self-sealing fixation assembly is in an interference fit with the optical substrate, the self-sealing fixation assembly and the optical substrate are locked with each other to cooperatively define the sealing cavity.

2. The display module according to claim 1, wherein, the self-sealing fixation assembly comprises:
   a rotation shaft, fixed to the upper portion of the receiving slot;
   a compression member, comprising a first compression strip and a second compression strip, wherein an end of the first compression strip is connected to an end of the second compression strip, an angle between the first compression strip and the second compression strip is not greater than 90 degrees;
   wherein, a through hole is defined in a connection between the first compression strip and the second compression strip, the compression member sleeves the rotation shaft through the through hole;

in the first state, the compression member is at a first position in which the first compression strip is attached to the slot wall; and in the second state, the compression member is at a second position, the second compression strip is attached to the slot wall, and the first compression strip compresses a side of the optical substrate away from the light source assembly in the direction toward the bottom of the receiving slot.

3. The display module according to claim 2, wherein the compression member is a one-piece and integral structure and is a thermoplastic polyurethane elastic member.

4. The display module according to claim 2, wherein the receiving slot is a stepped slot and comprises:

a first blind slot;

a second blind slot, wherein the second blind slot is defined in a central region of a bottom of the first blind slot, the light source assembly is arranged at a bottom of the second blind slot;

wherein a region of the bottom of the first blind slot surrounding the second blind slot is arranged with a protrusion, a snapping slot is defined between the protrusion and a slot wall of the first blind slot; the protrusion is arranged with a sealing adhesive; and in the second state, the protrusion supports an edge of the optical substrate.

5. The display module according to claim 4, wherein, the optical substrate comprises a body portion and a snapping portion disposed at an edge of the body portion, the snapping portion is extending perpendicularly to the body portion;

in the first state, the snapping portion abuts against the second compression strip in the direction towards the bottom of the receiving slot; and in the second state, the second compression strip is attached to the snapping portion to be snapped in the snapping slot; and a sum of a thickness of the snapping portion and a thickness of the second compression strip is equal to a size of an opening of the snapping slot to enable the optical substrate to be in the interference fit with the compression member to tightly lock the optical substrate.

6. The display module according to claim 5, wherein, an outer edge of a connection between the body portion and the snapping portion is configured as a smooth arc.

7. The display module according to claim 5, wherein the backplane defines a threaded hole, and the rotation shaft is detachably fixed to the receiving slot by threaded connection.

8. The display module according to claim 1, further comprising:

a heat circulating pipe group, comprising a heat absorbing portion and a heat releasing portion;

wherein, the heat absorbing portion is disposed between the bottom of the receiving slot and the light source assembly; and the heat releasing portion is disposed, relative to the heat absorbing portion, away from the light source assembly and is embedded in the backplane, the heat absorbing portion is fluidly connected to the heat releasing portion, and the coolant is received in the heat absorbing portion and is configured to freely move therein.

9. The display module according to claim 8, wherein, the coolant is ultrapure water.

10. A display device, comprising a display module and a border, wherein the border surrounds the display module, and the display module comprises:

a backplane, defining a receiving slot;

a light source assembly, arranged at a bottom of the receiving slot;

an optical substrate, snapped to an upper portion of the receiving slot, wherein a sealing cavity is defined between the optical substrate and the light source assembly;

a coolant, received in the sealing cavity;

a self-sealing fixation assembly, rotatably arranged on a slot wall of the receiving slot, wherein, in a first state, the optical substrate abuts against the self-sealing fixation assembly in a direction towards the bottom of the receiving slot; and, in a second state, the self-sealing fixation assembly is in an interference fit with the optical substrate, the self-sealing fixation assembly and the optical substrate are locked with each other to cooperatively define the sealing cavity.

11. The display device according to claim 10, wherein, the self-sealing fixation assembly comprises:

a rotation shaft, fixed to the upper portion of the receiving slot;

a compression member, comprising a first compression strip and a second compression strip, wherein an end of the first compression strip is connected to an end of the second compression strip, an angle between the first compression strip and the second compression strip is not greater than 90 degrees;

wherein, a through hole is defined in a connection between the first compression strip and the second compression strip, the compression member sleeves the rotation shaft through the through hole;

in the first state, the compression member is at a first position in which the first compression strip is attached to the slot wall; and in the second state, the compression member is at a second position, the second compression strip is attached to the slot wall, and the first compression strip compresses a side of the optical substrate away from the light source assembly in the direction toward the bottom of the receiving slot.

12. The display device according to claim 11, wherein the compression member is a one-piece and integral structure and is a thermoplastic polyurethane elastic member.

13. The display device according to claim 11, wherein the receiving slot is a stepped slot and comprises:

a first blind slot;

a second blind slot, wherein the second blind slot is defined in a central region of a bottom of the first blind slot, the light source assembly is arranged at a bottom of the second blind slot;

wherein a region of the bottom of the first blind slot surrounding the second blind slot is arranged with a protrusion, a snapping slot is defined between the protrusion and a slot wall of the first blind slot; the protrusion is arranged with a sealing adhesive; and in the second state, the protrusion supports an edge of the optical substrate.

14. The display device according to claim 13, wherein, the optical substrate comprises a body portion and a snapping portion disposed at an edge of the body portion, the snapping portion is extending perpendicularly to the body portion;

in the first state, the snapping portion abuts against the second compression strip in the direction towards the bottom of the receiving slot; and in the second state, the second compression strip is attached to the snapping portion to be snapped in the snapping slot; and a sum of a thickness of the snapping portion and a thickness of the second compression strip is equal to a size of an opening of the snapping slot to enable the optical substrate to be in the interference fit with the compression member to tightly lock the optical substrate.

15. The display device according to claim 14, wherein, an outer edge of a connection between the body portion and the snapping portion is configured as a smooth arc.

16. The display device according to claim 14, wherein the backplane defines a threaded hole, and the rotation shaft is detachably fixed to the receiving slot by threaded connection.

17. The display device according to claim 10, wherein the display module comprises a heat circulating pipe group, comprising a heat absorbing portion and a heat releasing portion;

wherein, the heat absorbing portion is disposed between the bottom of the receiving slot and the light source assembly; and the heat releasing portion is disposed, relative to the heat absorbing portion, away from the light source assembly and is embedded in the backplane, the heat absorbing portion is fluidly connected to the heat releasing portion, and the coolant is received in the heat absorbing portion and is configured to freely move therein.

18. The display device according to claim 17, wherein, the coolant is ultrapure water.

\* \* \* \* \*